(12) United States Patent
Brunner et al.

(10) Patent No.: US 7,416,820 B2
(45) Date of Patent: Aug. 26, 2008

(54) PELLICLE FILM OPTIMIZED FOR IMMERSION LITHOGRAPHY SYSTEMS WITH NA>1

(75) Inventors: Timothy A Brunner, Ridgefield, NY (US); Michael S Hibbs, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/669,175

(22) Filed: Jan. 31, 2007

(65) Prior Publication Data

US 2008/0182180 A1 Jul. 31, 2008

(51) Int. Cl.
*G03F 1/00* (2006.01)
(52) U.S. Cl. .............................. 430/5; 430/4
(58) Field of Classification Search ............ 430/4, 430/5
See application file for complete search history.

(56) References Cited

U.S. PATENT DOCUMENTS

| | | | |
|---|---|---|---|
| 5,723,860 A * | 3/1998 | Hamada et al. | 250/239 |
| 5,757,126 A * | 5/1998 | Harvey, III et al. | 313/506 |
| 5,772,817 A | 6/1998 | Yen et al. | |
| 6,190,743 B1 | 2/2001 | Wang | |
| 6,280,886 B1 | 8/2001 | Yan | |
| 6,475,575 B1 | 11/2002 | Ikuta et al. | |
| 6,824,930 B1 * | 11/2004 | Wheland et al. | 430/5 |
| 2002/0127360 A1 | 9/2002 | Kurata et al. | |
| 2003/0096178 A1 | 5/2003 | Fujita et al. | |
| 2005/0042524 A1 | 2/2005 | Bellman | |
| 2005/0214655 A1 | 9/2005 | Zimmerman et al. | |

FOREIGN PATENT DOCUMENTS

| | | |
|---|---|---|
| JP | 06222551 | 12/1994 |
| JP | 2005070120 | 3/2005 |

* cited by examiner

*Primary Examiner*—Geraldina Visconti
(74) *Attorney, Agent, or Firm*—DeLio & Peterson, LLC; John J. Tomaszewski; Richard Kotulak

(57) ABSTRACT

An optical pellicle to protect a photomask from particulate contamination during semiconductor lithography is provided which has enhanced transparency and operational characteristics. The pellicle utilizes alternating layers of a transparent polymer and a transparent inorganic layer to form pellicles which have high transmission properties and high strength. In a preferred pellicle, a three-layer pellicle is provided having a transparent inorganic layer sandwiched between two polymer layers. A five-layer pellicle is also provided with the outer layers and a middle layer being polymer layers and the inner layers an inorganic material. The preferred polymer layer is a perfluorinated polymer such as Teflon® and the preferred inorganic material is silicon dioxide. The pellicle of the invention provides light transmission of greater than 0.99% at incident light angles up to arcsine 0.45.

14 Claims, 4 Drawing Sheets

PELLICLE FILM OPTIMIZED FOR IMMERSION LITHOGRAPHY SYSTEMS WITH NA>1

BACKGROUND OF THE INVENTION

1. Field of the Invention

The present invention relates to the field of semiconductor lithography, and, more particularly, to optical pellicles to protect photomasks from particulate contamination.

2. Description of Related Art

In the semiconductor chip industry it is well known that pattern transfer from a photomask (or mask) to a substrate is accomplished by exposing a photomask to a light source. During the pattern transfer process, also called the photolithographic process, patterns on the photomask are projected onto the substrate which has been treated with a photo-sensitive substance. This results in the mask openings in the mask forming the pattern being reproduced onto the substrate. Unfortunately, any foreign substance on the surface of the mask will also be reproduced on the substrate and therefore will interfere with proper pattern transfer to the substrate.

To eliminate contamination of the mask surface, a frame holding a thin membrane known as a pellicle is mounted above the mask surface, such that the pellicle membrane extends parallel to the mask at a predetermined distance spaced away from it. Any contamination which would ordinarily land on the mask surface instead falls on the pellicle membrane.

Pellicles substantially eliminate the above exposure problem because contamination on the pellicle membrane will not be projected onto the substrate. The frame of the pellicle supports the membrane at a distance spaced away from the mask surface so any particles or other contaminants on the pellicle membrane will be out of focus during pattern transfer.

The pellicle typically comprises a polymer membrane approximately one micrometer thick that is stretched over a frame which is affixed to a mask, also referred to as a "reticle." Although the pellicle is in the optical path, the polymer thickness is typically small since imaging performance degradation generally increases with increasing pellicle thickness.

Pellicles serve as dust covers of reticles and protect the increasingly more expensive reticles from being contaminated in the lithographic process. Usually, a pellicle is an assembly comprising a thin pellicle membrane layer attached to a pellicle mount frame. Because the pellicle layer has a thin thickness compared to a relatively large surface area, the layer is usually called a membrane or a film. Typically, the pellicle layer has been made by stretching a thin (1 μm) polymer layer over an aluminum frame. Aside from other concerns such a pellicle does not appear viable for new 157 nm and shorter wavelength applications because the polymers rapidly degrade under the exposure of these wavelengths.

Many pellicle membranes are fabricated of nitrocellulose or cellulose acetate, while deep UV pellicle membranes are commonly fabricated of a fluoropolymer such as Cytop® from Asahi Glass or Teflon® AF fluorocarbon amorphous polymer from DuPont. Cytop is a poly-perfluoro polymer containing a cyclic ether functional group, such as poly-perfluoro cyclo oxyaliphatic polymer. Typically a solution of the polymer is used, such as an 8% solution, and the solution is spun onto a substrate, the solvent is baked off, and the membrane is removed from the substrate in a peeling operation.

The membrane may also be formulated of Teflon AF amorphous fluoropolymer from DuPont. Teflon AF fluorocarbon is a family of amorphous copolymers of per-fluoro (2,2-dimethyl-1,3 dioxole)(PDD) and tetrafluoroethylene. Teflon AF fluorocarbon is typically based on 2,2-bistrifluoromethyl-4,5-difluoro-1,3-dioxole with fluorine-containing monomers. A solution of Teflon AF amorphous fluoropolymer is dissolved in a solvent such as Fluorinert FC-75 from 3M and spin coated to form the membrane.

An alternative was proposed by SEMATECH to use a hard pellicle comprised of silica or doped silica. Because silica has a higher modulus and density than polymer layers, initial efforts have focused on very thick (300-800 μm) silica plates to avoid sag, which causes wavefront distortion. Because of the large optical thickness of these hard pellicles, very tight specifications on absorption, flatness, bow, and wavefront distortion have been set by SEMATECH to minimize the impact on performance of the projection lithographic system.

Current pellicles however fail at a high Numerical Aperture (NA). At low angles of incidence, the pellicles are commercially acceptable but at large angles the pellicle fails to transmit all of the light. The light lost from imperfect transmission is reflected and causes undesirable ghost images. The amount of reflective loss is dependent on both the incident angle and the polarization of the incident light. State-of-the-art immersion exposure tools with a NA>1 are particularly prone to such problems and prior art pellicle structures cause significant image degradation. It is these angle-dependent reflections which are the main problem addressed by the present invention.

Bearing in mind the problems and deficiencies of the prior art, it is therefore an object of the present invention to provide an optical pellicle which has enhanced transparency and operational properties.

Another object of the present invention is to provide a method for making an optical pellicle.

A further object of the present invention is to provide a method for imaging a substrate such as a semiconductor using the pellicle of the invention.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to a pellicle for a mask comprising alternating layers of a transparent polymer layer and a transparent inorganic layer, wherein the pellicle has at least three layers, the outside layers are the transparent polymer and the polymer layer preferably has a lower index of refraction than the inorganic layer.

In another aspect of the invention the pellicle comprises a transparent inorganic layer sandwiched between two polymer layers.

In a still further aspect of the invention the pellicle comprises five alternating layers with the outer layers and middle layer being polymer layers and the inner layers an inorganic material.

In preferred aspects of the invention the polymer layer is a perfluorinated polymer and the inorganic layer is silicon dioxide.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
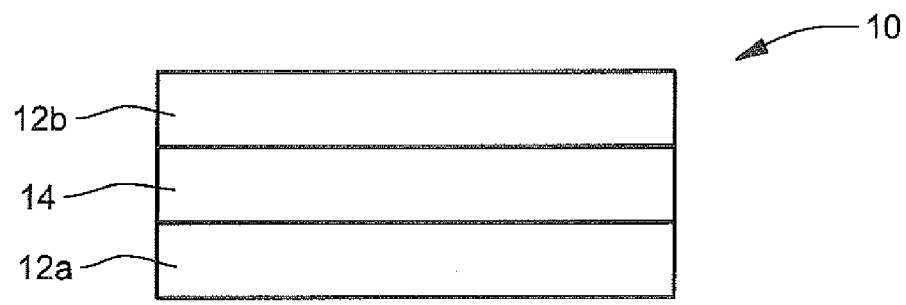
FIG. 1 is a cross sectional view of a three layer pellicle of the invention comprising a silicon dioxide layer sandwiched between two polymer layers.

In describing the preferred embodiment of the present invention, reference will be made herein to FIGS. 1-7 of the drawings in which like numerals refer to like features of the invention. Features of the invention are not necessarily shown to scale in the drawings.

The polymer used to form the polymer layers of the pellicle of the invention may be any suitable polymer which is transparent to the exposure wavelength, preferably 193 mm and below, is resistant to degradation at the exposure wavelength for long periods such as up to two (2) years of normal production use of the photomask and that the polymer have sufficient strength to form a uniform, thin film of sufficient strength to form a free-standing film. The polymer is preferably a perfluorinated polymer. In preferred embodiments the polymer is PTFE, FEP, PFA, and/or polytetrafluoroethylene co-perfluoroisobutylene. As used herein "perfluorinated polymers" include any compound that is composed substantially of carbon and fluorine and any compound that is composed substantially of carbon, fluorine, and oxygen. Examples of perfluorinated polymers include: polytetrafluoroethylene (PTFE), polytetrafluoroethylene-co-hexafluoropropene (FEP), polytetrafluoroethylene co-perfluoroisobutylene, and polytetrafluoroethylene co-perfluoroalkoxy (PFA). Perfluorinated polymers also include fluorinated polymers and fluorinated-polymeric materials.

Perfluorinated polymers include compositions that are composed essentially of any combination of perfluorinated polymers. For example, a perfluorinated polymer would include a material that comprises a combination of PTFE, FEP, and PFA; in this example, this perfluorinated polymer might be a single molecule that includes PTFE, FEP and PFA moieties that are attached by molecular bonds; alternatively, in this example, the perfluorinated polymer might be a mixture of PTFE, FEP, and PFA.

For the other one or more interleaved layers of the pellicle of the invention, silicon dioxide is preferably used as the pellicle sheet inorganic layer. Other transparent inorganic materials may be used such as magnesium fluoride. Silicon dioxide is preferred because of its demonstrated effectiveness and because of manufacturable methods for depositing thin films of silicon dioxide onto the polymer film.

The silicon dioxide sheet of the present invention may be produced by any suitable method such as a direct method, a soot method (VAD method or OVD method), a sol-gel method, or a plasma method. A coating process such as plasma enhanced CVD is preferred and it is preferred to start with a polymer layer and then to deposit a silicon dioxide film on the polymer layer. These deposition methods are all well known in the art.

Referring now to the figures, FIG. 1 shows a three-layer pellicle of the invention as numeral 10. The pellicle comprises a silicon dioxide layer 14 sandwiched between polymer layers 12a and 12b.

Figure 2:
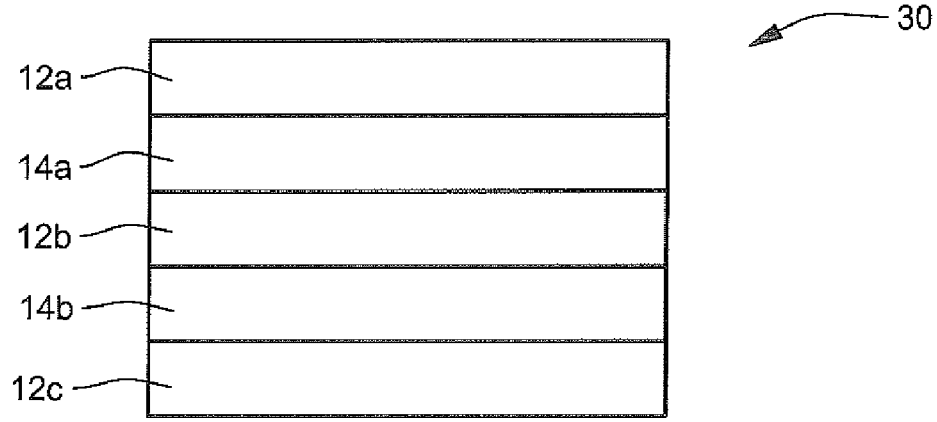
FIG. 2 is a cross sectional view of a five layer pellicle of the invention comprising three polymer layers including a top layer, a bottom layer, and a middle layer with two silicon dioxide layers sandwiched therebetween.

FIG. 2 shows a five layer pellicle of the invention as numeral 30. The pellicle comprises in sequence, a lower polymer layer 12c, a silicon dioxide layer 14b, a middle polymer layer 12b, a silicon dioxide layer 14a, and an upper polymer layer 12a.

Broadly stated, the polymer layers are about 20 to 900 nm thick, preferably 20 to 100 nm and most preferably 20 to 50 nm, e.g., 30 nm. The inorganic layers are about 20 to 500 nm thick, preferably 20 nm to 210 nm and most preferably 20 to 40 nm, e.g., 31 nm. These thicknesses may vary widely for different applications depending on the desired transparency and operational process parameters. It is highly preferred that the thickness of each layer be substantially uniform for enhancing optical performance.

Figure 3A:
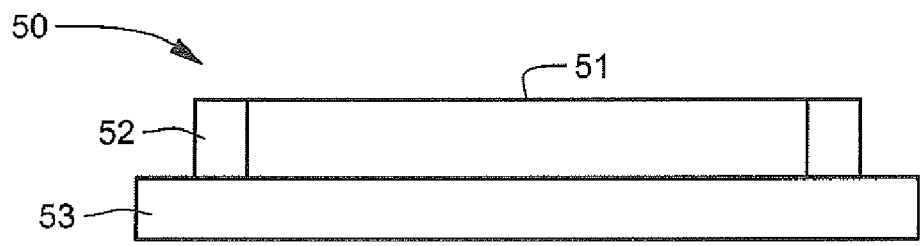
FIG. 3A is a schematic illustration of how a pellicle is used to protect a patterned photomask.

FIG. 3A is a schematic showing how a pellicle 50 is used to protect a patterned photomask 53 from dust or other debris. The pellicle comprises a pellicle film 51 supported on a pellicle frame 52.

Figure 3B:
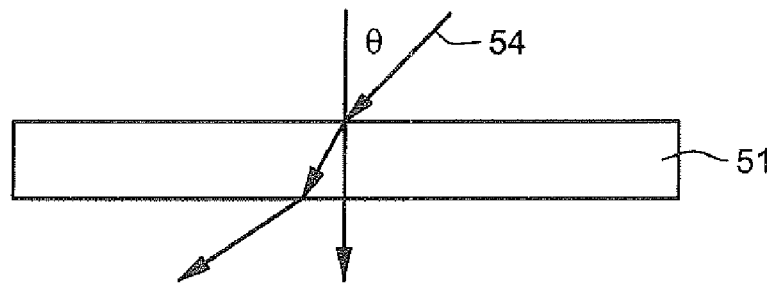
FIG. 3B is a schematic illustration of light at an incident angle θ impinging upon the pellicle film surface.

FIG. 3B shows the transmission of light 54 through the pellicle film 51 at an incident angle θ.

Figure 4:
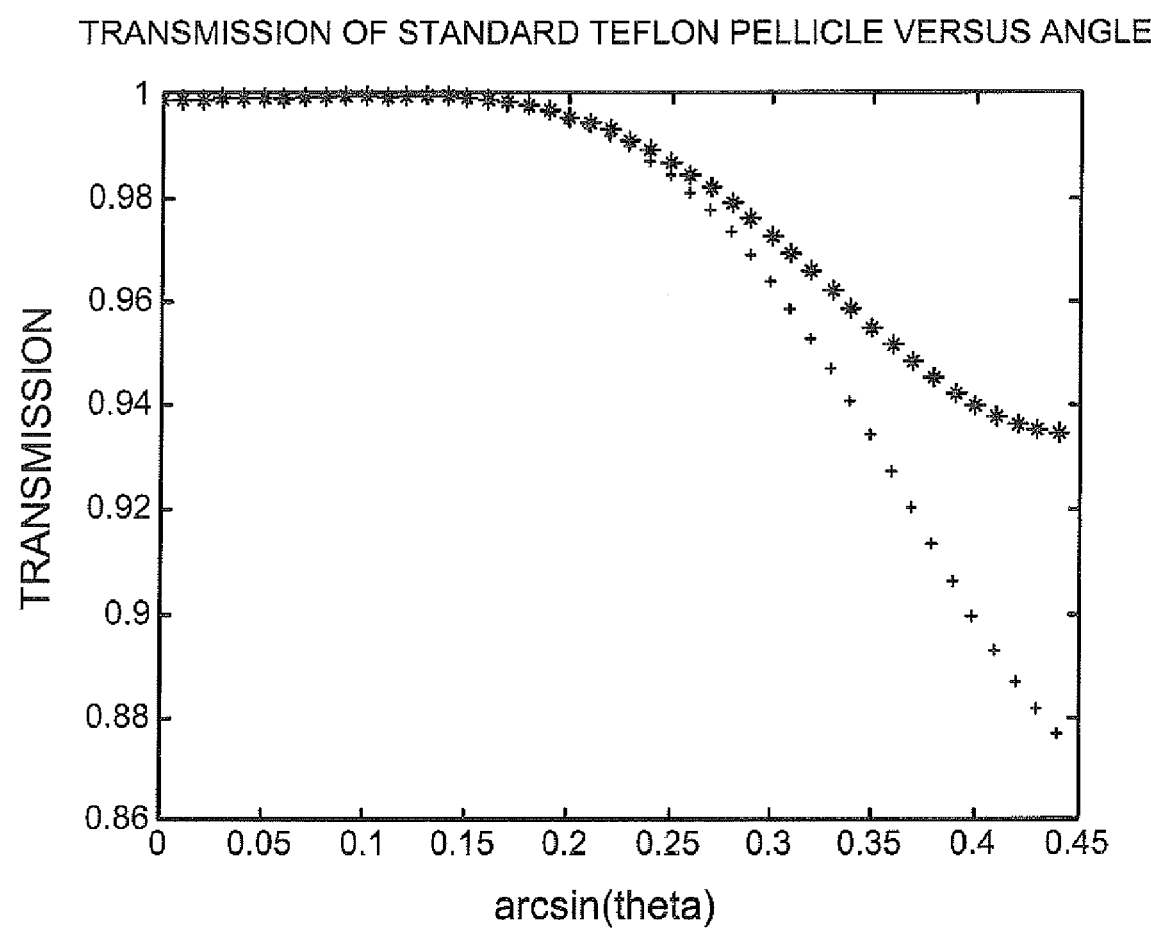
FIG. 4 is a graph showing the transmission of light through a pellicle at different incident angles for a standard Teflon® pellicle of the prior art.

FIG. 4 shows the transmission of light through a prior art pellicle comprising a polymer layer at different incident light angles. As can be seen, as the incident angle θ increases the transmission falls sharply below about 0.99 at an incident angle of approximately arcsine 0.22. This corresponds to 4× optics with NA=0.88 and is unacceptable for NA>0.88. The polymer is Teflon® and has an n=1.375 and a thickness of 635 nm.

Figure 5A:
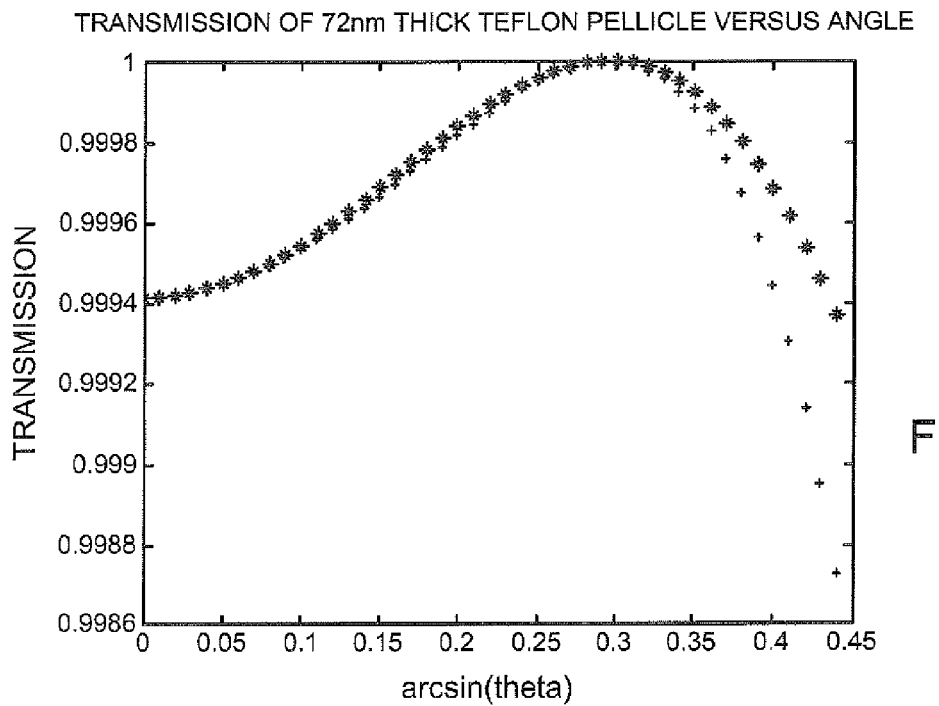
FIG. 5A is a graph showing the transmission of light through a pellicle at different incident angles wherein the pellicle comprises a polymer layer having a thickness of 72 nm.
Figure 5B:
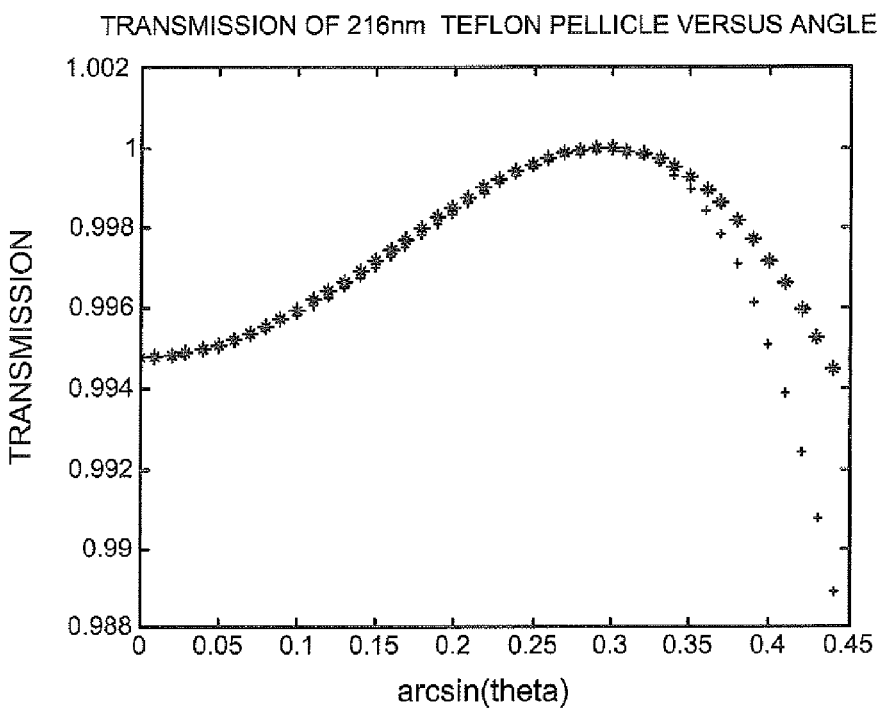
FIG. 5B is a graph showing the transmission of light through a pellicle at different incident angles wherein the thickness of the pellicle is a polymer layer having a thickness of 216 nm.

In FIG. 5A, when the thickness of the polymer film is decreased to a thickness of about 72 nm, the transmission is greater than 0.9986 for all incident angles. However, the physical robustness of such a thin film is questionable and would not be commercially effective. When the thickness of the polymer film is increased as shown in FIG. 5B to a thickness of about 216 nm, the transmission is greater than 99% for all incident angles. However, such a pellicle is still not commercially acceptable.

Figure 6:
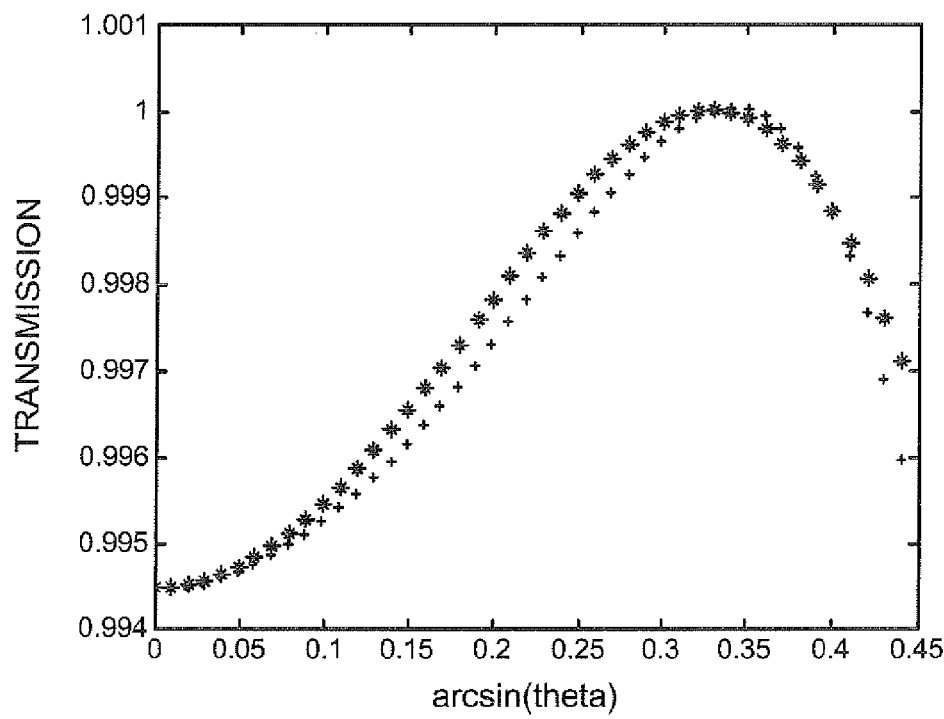
FIG. 6 is a graph showing the transmission of light through a three layer pellicle of the invention at different incident angles.

In FIG. 6 a three layer pellicle of the invention is shown which comprises two outer polymer layers of Teflon® of 30 nm thickness each and a sandwiched silicon dioxide layer of 205 nm. As can be seen the transmission is greater than 0.994 for all incident angles up to arcsine 0.45 and is a commercially effective pellicle especially for 4× optics up to NA=1.8.

Figure 7:
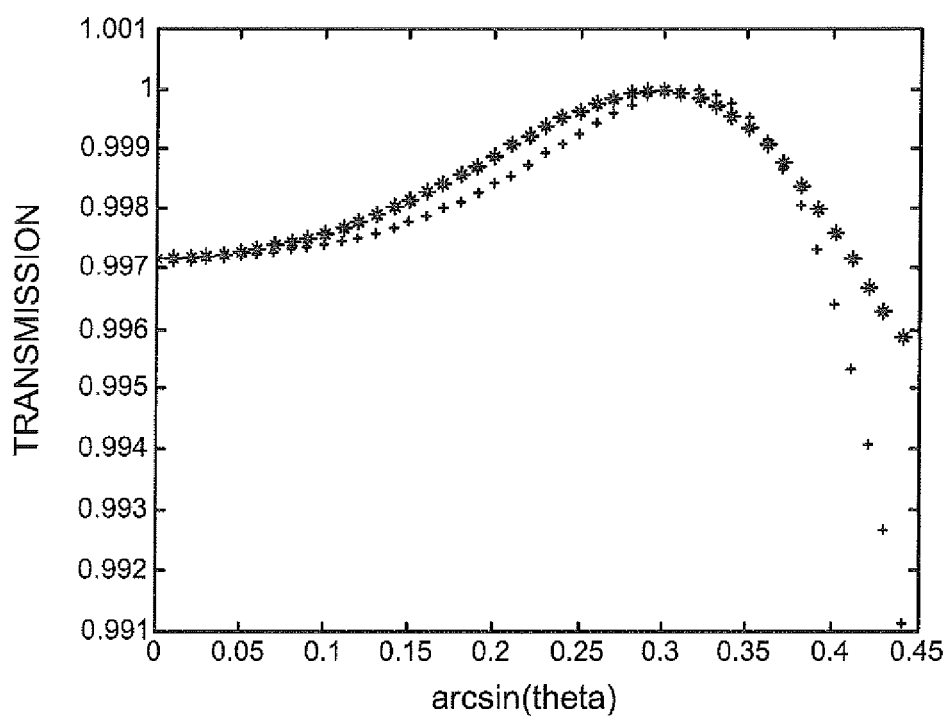
FIG. 7 is a graph showing the transmission of light through a five layer pellicle of the invention at different incident angles.

Similarly, FIG. 7 is a five layer sandwiched pellicle of the invention and comprises two outer Teflon® layers of 35 nm each, two sandwiched silicon dioxide layers of 31 nm each, and a center Teflon® layer of 519 nm. The pellicle has a transmission of greater than 0.99 for all incident angles up to arcsine 0.45 and is effective for commercial use.

FIGS. 4 through 7 show calculated transmission versus incident angle curves. The two curves represent two orthogonal polarization states. The X axis for all of these graphs has arcsine (theta) ranging from 0 to 0.45. Industry standard production imaging tools use 4× reduction optics, such that the maximum incident angle at the pellicle (near the reticle) is 4 times smaller than the NA of the imaging optics at the wafer. Therefore, if we achieve acceptable transmission for both polarizations over the entire range from 0 to 0.45, the pellicle will work perfectly for all imaging optics with NA<4*0.45=1.8. The current state-of-the-art immersion exposure tool has NA=1.2, where arcsine (theta) at the pellicle is less than 0.3. Therefore, the flat curves we demonstrate over the full range of sine (theta) from 0 to 0.45 demonstrate excellent optical performance not only for current exposure tools, but also are applicable for future tools with higher NAs even beyond the expected limits for this technology.

While not preferred, for some pellicles the outer layers may be the inorganic material.

While the present invention has been particularly described, in conjunction with a specific preferred embodiment, it is evident that many alternatives, modifications, and variations will be apparent to those skilled in the art in light of the foregoing description. It is therefore contemplated that the appended claims will embrace any such alternatives, modifications, and variations as falling within the true scope and spirit of the present invention.

What is claimed is:

1. A pellicle to protect a photomask from dust or other debris comprising;
   a pellicle frame; and
   a pellicle film supported on the pellicle frame comprising:
       alternating layers of a transparent polymer layer and a transparent inorganic layer, wherein the pellicle has at least three layers, the outside layers are the transparent polymer and the polymer layer has a lower index of refraction than the inorganic layer.

2. The pellicle of claim 1 wherein a transparent inorganic layer is sandwiched between two polymer layers.

3. The pellicle of claim 1 wherein the polymer layer is a perfluorinated polymer and the inorganic layer is silicon dioxide.

4. The pellicle of claim 2 wherein the polymer layer is a perfluorinated polymer and the inorganic layer is silicon dioxide.

5. The pellicle of claim 1 comprising five layers with upper and lower outer layers being a transparent polymer, inner layers an inorganic material, and a middle layer of a transparent polymer.

6. The pellicle of claim 5 wherein the polymer layers are a perfluorinated polymer and the inorganic layers are silicon dioxide.

7. A method for using a photomask comprising the following steps:
   positioning a photomask in an imaging system;
   positioning a pellicle over the photomask to protect the photomask from dust or
       other debris, the pellicle comprising:
   a pellicle frame; and
   a pellicle film supported on the pellicle frame comprising:
       alternating layers of a transparent polymer layer and a transparent inorganic layer, wherein the pellicle has at least three layers, the outer layers are the transparent polymer, and the polymer layer has a lower index of refraction than the inorganic layer; and
   imaging the photomask.

8. The method of claim 7 wherein the pellicle has three layers.

9. The method of claim 8 wherein the polymer is a perfluorinated polymer and the inorganic layer is silicon dioxide.

10. The method of claim 7 wherein the pellicle has five layers.

11. The pellicle of claim 1 having three layers wherein the outside layers are the transparent inorganic layers and the inner layer is the transparent polymer layer.

12. The pellicle of claim 1 comprising five layers with upper and lower outer layers being a transparent inorganic material, inner layers a transparent polymer and a middle layer of a transparent inorganic material.

13. The method of claim 7 wherein the pellicle has three layers wherein the outside layers are the transparent inorganic layers and the inner layer is the transparent polymer layer.

14. The method of claim 7 wherein the pellicle has five layers with upper and lower outer layers being a transparent inorganic material, inner layers being a transparent polymer and a middle layer of a transparent inorganic material.

* * * * *